United States Patent
Gulsun et al.

(10) Patent No.: US 9,689,949 B2
(45) Date of Patent: Jun. 27, 2017

(54) PHASE UNWRAPPING IN PHASE CONTRAST MR IMAGING

(71) Applicant: Siemens Healthcare GmbH, Erlangen (DE)

(72) Inventors: Mehmet Akif Gulsun, Lawrenceville, NJ (US); Marie-Pierre Jolly, Hillsborough, NJ (US); Christoph Guetter, Lawrenceville, NJ (US)

(73) Assignee: Siemens Healthcare GmbH, Erlangen (DE)

( * ) Notice: Subject to any disclaimer, the term of this patent is extended or adjusted under 35 U.S.C. 154(b) by 1263 days.

(21) Appl. No.: 13/644,005

(22) Filed: Oct. 3, 2012

(65) Prior Publication Data
US 2013/0093423 A1  Apr. 18, 2013

Related U.S. Application Data

(60) Provisional application No. 61/546,076, filed on Oct. 12, 2011.

(51) Int. Cl.
*G01R 33/48* (2006.01)
*G01R 33/563* (2006.01)
*G01R 33/565* (2006.01)

(52) U.S. Cl.
CPC . *G01R 33/56316* (2013.01); *G01R 33/56545* (2013.01)

(58) Field of Classification Search
CPC .............. G01R 33/56316; G01R 33/56545
USPC ................................. 324/300–322
See application file for complete search history.

(56) References Cited

U.S. PATENT DOCUMENTS

| 5,432,447 | A  | * | 7/1995 | Song | G01R 33/565 324/307 |
| 8,482,285 | B2 | * | 7/2013 | Grissom | G01R 33/4804 324/312 |
| 2004/0135577 | A1 | * | 7/2004 | Yatsui | G01R 33/56563 324/307 |
| 2010/0283463 | A1 | * | 11/2010 | Lu | G01R 33/243 324/309 |
| 2012/0121200 | A1 | | 5/2012 | Guetter et al. | |

OTHER PUBLICATIONS

Jenkinson, M. (2003), Fast, automated, N-dimensional phase-unwrapping algorithm. Magn Reson Med, 49: 193-197. doi: 10.1002/mrm.10354.*
C. Guetter, et al., "Efficient Symmetric and Inverse-Consistent Deformable Registration Through Interleaved Optimization," Siemens Corporate Research, Princeton, NJ, USA, pp. 590-593, IEEE 2011.

* cited by examiner

*Primary Examiner* — Melissa Koval
*Assistant Examiner* — Rishi Patel

(57) ABSTRACT

Phase unwrapping is provided for phase contrast magnetic resonance (MR) imaging. The velocity values are unaliased. For a given location over time, a path over time through a directed graph of possible velocities at each time is determined by minimization of derivatives over time. The possible velocities are based on the input velocity, the input velocity wrapped in a positive direction, and the input velocity wrapped in a negative direction, so the selection to create the minimum cost path represents unaliasing of any aliased velocities.

20 Claims, 4 Drawing Sheets

PHASE UNWRAPPING IN PHASE CONTRAST MR IMAGING

RELATED APPLICATIONS

The present patent document claims the benefit of the filing date under 35 U.S.C. §119(e) of Provisional U.S. Patent Application Ser. No. 61/546,076, filed Oct. 12, 2011, which is hereby incorporated by reference.

BACKGROUND

The present embodiments relate to phase unwrapping. In particular, aliasing of velocity data in phase contrast magnetic resonance (MR) imaging is reduced or removed.

Phase contrast MRI is often used to visualize blood moving through blood vessels. The acquisition may include at least two image sequences. Magnitude images show the anatomy of the vessels, and the phase contrast images show the velocity of the blood through those vessels. FIG. 1 shows a magnitude or intensity MR image of anatomy, above the heart in this example. FIG. 2 shows the phase contrast MR image of the same patient region. In FIG. 2, the outer grey ring 30 is tissue, the middle ring black and white region 32 is the lungs, the dark region 34 is negative velocities, and the light region 36 is positive velocities.

For phase contrast MRI, phase images with and without velocity encoding gradient are subtracted to measure a signal proportional to physical velocity. The phase difference, in one example, is represented using 12 bits in unsigned short format. The phase difference is assigned a number between 0 and 4095. This signal is then converted to physical velocity by a velocity encoding parameter (VENC). The VENC is related to the magnitude of the velocity encoding gradient. In the 12 bit phase example, the VENC is used to calculate the physical velocity so that 0 represents a velocity of −VENC, 2048 represents a zero velocity, and 4095 represents a velocity of +VENC.

When the actual velocity is higher than the VENC, the resulting estimated velocity is wrapped or aliased. For example, the VENC is chosen at 100 m/s. The maximum actual velocity (one of the actual velocities) in the aorta being imaged is 150 m/s. In this case, the gray value for the velocity should be 5119, but that is larger than 4095. Instead, the value is wrapped around and becomes 1024, which appears to be a velocity of −50 m/s after applying the VENC. FIG. 3 shows a phase contrast MR image with this VENC aliasing. As compared to FIG. 2, the aorta region that should be light or white in the center is aliased as black. FIGS. 1-3 are shown in grayscale, but may be colorized. For example, flow in one direction is mapped to red shades and flow in another direction is mapped to blue shades. In grayscale, black or dark is mapped to negative velocities and white or light is mapped to positive velocities. In FIG. 3, the dark interior of the generally light region is due to aliasing.

This aliasing may be confusing. Measurements made based on velocity may be distorted. For example, a calculation of an average velocity inside the aorta is tainted by the wrong or aliased velocities. The VENC may be reset to a larger value, but this may be time consuming and may result in selection of an overly large VENC just to avoid aliasing. A larger VENC than needed reduces the dynamic range of the velocity information.

BRIEF SUMMARY

By way of introduction, the preferred embodiments described below include methods, systems, instructions, and computer readable media for phase unwrapping in phase contrast magnetic resonance (MR) imaging. The velocity values are unaliased. For a given location over time, a path over time through a directed graph of possible velocities at each time is determined by minimization of derivatives over time. The possible velocities are based on the input velocity, the input velocity wrapped in a positive direction, and the input velocity wrapped in a negative direction, so the selection to create the path represents unaliasing of any aliased velocities.

In a first aspect, a method is provided for phase unwrapping in phase contrast magnetic resonance (MR) imaging. A sequence of phase contrast MR data representing a patient is acquired. The phase contrast MR data comprises first values representing a location at respective different times. Some of the first values are wrapped values and some of the first values are not wrapped values. The wrapped first values are unwrapped by minimizing a cost function in a graph of the first values. An image is generated as a function of the unwrapped values and the not wrapped first values.

In a second aspect, a non-transitory computer readable storage medium has stored therein data representing instructions executable by a programmed processor for phase unwrapping in phase contrast magnetic resonance (MR) imaging. The storage medium includes instructions for unaliasing velocities with a cost function based on minimization of an absolute sum of temporal derivatives along a graph of possible values over time, and generating an image as a function of the unaliased velocities.

In a third aspect, a non-transitory computer readable storage medium has stored therein data representing instructions executable by a programmed processor for phase unwrapping in phase contrast magnetic resonance (MR) imaging. The storage medium includes instructions for generating a graph of different velocity values for a location at each of different times, determining a velocity profile of velocity as a function of time from a path with a minimum cost through the graph, the path having one of the different velocity values for each of the times, and generating an image as a function of the velocity profile.

The present invention is defined by the following claims, and nothing in this section should be taken as a limitation on those claims. Further aspects and advantages of the invention are discussed below in conjunction with the preferred embodiments and may be later claimed independently or in combination.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE DRAWINGS AND PRESENTLY PREFERRED EMBODIMENTS

Figure 4:
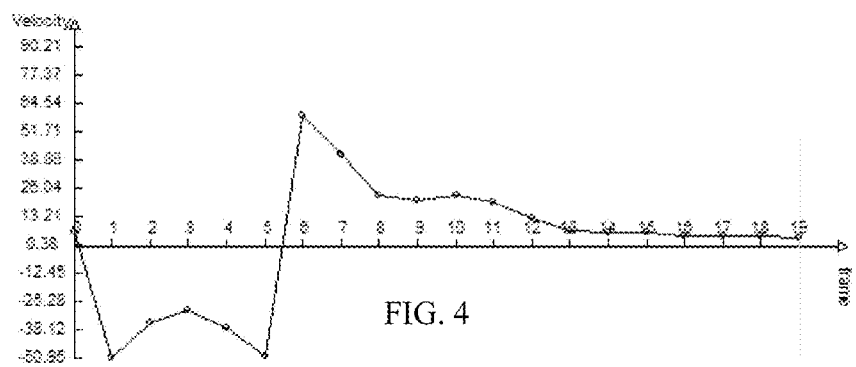
FIG. 4 is an example graph of a velocity profile, with aliasing, for a location.

Accurate phase unwrapping is provided in phase contrast MR sequences. A clue to the aliasing of a pixel is through the profile over time of the velocity for the pixel. A typical or unaliased profile should be smooth in time. An aliased profile jumps from large positive values to large negative values or vice-versa. FIG. 4 shows a velocity profile with aliasing at frames 1-5. Large and rapid transitions in the velocity indicate aliasing. Since the frames are acquired at different times, the frame axis also represents time.

The pixel is anti-aliased or unaliased using the temporal velocity profile. The anti-aliasing is based on energy minimization using dynamic programming. The dynamic programming uses a graph of possible velocity values for each time. For each time in a sequence, the velocity for a location is used to create values unwrapped in the positive and negative directions. The velocity, positive, and negative values are possible velocities. A velocity profile (velocity as a function of time) for a location is determined by selection from the possible velocities for each time. The possible velocities are selected based on minimizing differences over the sequence. The differences may be represented as first or second derivatives.

Figure 1:
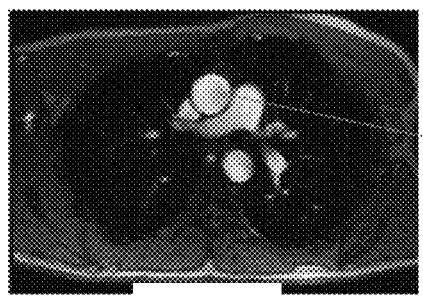
FIG. 1 is an example MR magnitude image of a region of a patient.

FIG. 1 shows a flow chart of a method for phase unwrapping in phase contrast magnetic resonance (MR) imaging. The method is implemented by the system of FIG. 12 or another system. For example, the method is implemented on a computer or processor associated with a MR imaging system or PACS. The acts are performed in the order shown or other orders. Additional, different, or fewer acts may be provided. For example, the method is performed with the process flow of FIG. 8 or 10. As another example, the unaliasing of act 14 is provided without one or more of the acts 16, 18, and/or 20. In yet another example, the display of act 22 is not provided, but instead the corrected velocities are used to calculate a value.

In act 12, a sequence of phase contrast MR data representing a patient is acquired. Magnetic resonance data is acquired with an MR system. The MR data is acquired using an imaging sequence of pulses for scanning a patient. In response to application of magnetic fields and one or more pulses, data representing an interior region of a patient is acquired. The magnetic resonance data is k-space data.

Fourier analysis is performed to reconstruct the data from the k-space into object or image space. The MR data represents a one, two, or three-dimensional region of the patient. For example, the MR data represents an area or slice of the patient. Values are provided for each of multiple locations distributed in two or three dimensions. The MR data is acquired as a frame of data. A frame of data represents the scan region at a given time or period.

The phase contrast MR data represents velocities. MR data with and without a velocity encoding gradient are acquired and subtracted. Any velocity imaging technique may be used. The result is converted with the VENC. Any VENC may be used, such as a value predetermined or selected by the user. The resulting velocities are phase contrast MR data. Since anti-aliasing has not yet been performed, the velocities may be considered as original values. The original values may or may not be aliased.

A sequence of phase contrast MR data is acquired. The sequence includes a plurality of frames of velocities. Each frame represents the same or overlapping region at a given time. Different frames represent different times. The sequence of frames covers any period, such as twenty frames over a fraction of a second, seconds, tens of seconds, or minutes.

Anatomy MR data may also be acquired. Intensities representing MR response of one or more tissues are acquired. Any now known or later developed anatomy imaging using MR may be used. Frames of the anatomy MR data representing the different times are acquired.

In act 14, anti-aliasing is performed. The velocities are unaliased with a cost function based on minimization of an absolute sum of temporal derivatives along a graph of possible values over time. Other unaliasing may be used.

The aliasing is removed using the temporal profile of velocities. The unaliasing is performed for each of a plurality of spatial locations. A velocity profile is provided for each location. The frames of phase contrast MR data from different times provide the temporal profile.

The unaliasing operation is independently or separately determined for each location. In alternative embodiments, the removal of aliasing is weighted or uses information from neighboring locations. For example, a neighborhood check is applied to the unaliased data. To enforce spatial consistency between neighboring pixels, the selection of velocities may be based, at least in part, on whether the neighboring velocities are aliased. For example, a probability of aliasing is determined for each location at a given time. Using a Markov random field or other approach, the selections of the possible velocities may be based in part on the probability for the location and probabilities for adjacent locations.

Figure 2:
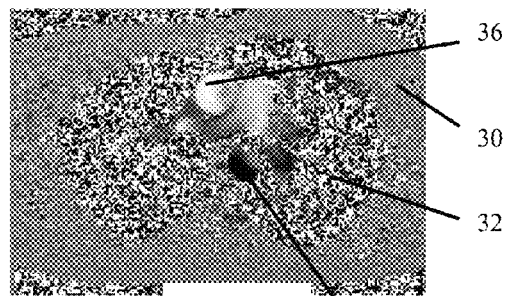
FIG. 2 is an example phase contrast MR image, without aliasing, of the region of the patient.
Figure 3:
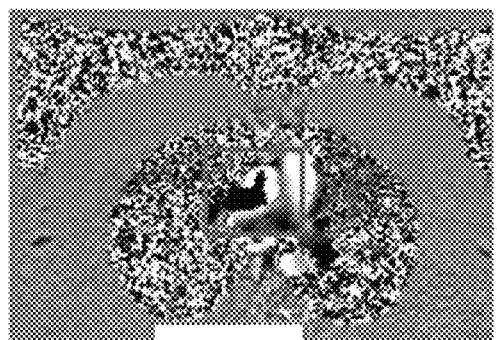
FIG. 3 is an example phase contrast MR image, with aliasing, of the region of the patient.

Acts 16, 18, and 20 are one example of unaliasing. Additional, fewer, or different acts may be provided to remove aliasing. For example, segmentation is performed prior to calculating possible values in act 16. In the flow represented by acts 16, 18, and 20, a velocity is received for each location of interest. The locations of interest may be selected by the user. The locations may be determined by processing. As represented in FIG. 2, the lung region 32 has variance in velocity. The phase unwrapping correction is applied to locations that are not part of the noisy areas filled with air. Locations associated with a threshold amount of variance over a kernel may be excluded from the unaliasing operation. The kernel size is selected to allow for variance associated with the aorta or blood flow while removing other variance. A velocity threshold may additionally or alternatively be used, such as applying phase unwrapping correction to locations that have maximum velocities above a threshold and not other locations. In another example, when the velocities over time at a location are close (e.g., 10 cm/s with a VENC of 100 cm/s) to 0 throughout the entire time profile, the velocities are most likely not aliased, so correction is not applied. Other approaches may be used.

In act 16, possible velocity values for each time are calculated. The velocity of the phase contrast MR data is one possible value. This initial or input velocity in not wrapped (not aliased) or is to be unwrapped (is aliased). Any aliasing may be positive or negative. Positive and negative values are calculated by wrapping the input velocity value. Positive and negative corrected velocities are calculated from the input velocity.

To calculate the positive and negative values, a correction value is determined. The correction value is two times the velocity scale. The VENC provides the velocity scale. For example, the VENC is 100 cm/s. The correction value is 200 cm/s. Since the VENC provides an absolute value for magnitude, the velocity scale may be considered 200 cm/s where the VENC is 100 cm/s. In this case, the velocity scale without the doubling is used.

For the positive values, the correction value is subtracted from the input velocity. For example, the 200 cm/s is subtracted from an input velocity of 58 cm/s, providing −142 cm/s. For negative values, the correction value is added to the input velocity. In the example above, 200 cm/s is added to the input velocity of 58 cm/s, providing 258 cm/s.

In this embodiment, the possible velocity values are the initial value, the positive value, and the negative value. In the example above, the possible values are 58 cm/s, −142 cm/s, and 258 cm/s. These possible values represent correct estimation (first value), positive aliasing (positive value) or negative aliasing (negative value). One of these three velocity values is the actual velocity.

For a given location, the possible velocities are calculated for each time. In the twenty frame example, possible velocities are calculated for the location at each of twenty times. More or fewer than twenty frames and corresponding times may be used.

Figure 6:
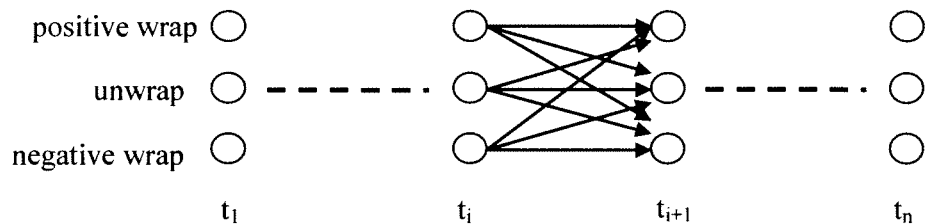
FIG. 6 is one embodiment of a directed graph for unaliasing a velocity profile.

FIG. 6 shows one representation of the calculation of possible velocity values. FIG. 6 is a directed graph representation. The graph is for one location. Different velocity values are provided for each time. The different velocity values are the possible velocities. The number of rows in the graph corresponds to or is the same as the number of possible velocity values. The number of columns in the graph corresponds to or is the same as the number of frames or discrete times. Other graph or non-graph representations may be used.

In the graph of FIG. 6, the positive, original, and negative possible velocities are shown as bullets or circles (nodes) at each time. The nodes are labeled by the possible velocities. A path through the graph may be found to determine which of the possible values to use. The location is labeled for each time point with one of the three different cases: unwrap (original), positive value or negative value. Based on the labels for the entire time series, a new velocity profile is generated where the original input velocity value remains for the time points labeled with unwrap, 2×VENC is subtracted from the original velocity value for the time points labeled with positive wrap, and 2×VENC is added to the original velocity value for the time points labeled with negative wrap. The graph is a dynamic programming graph for the minimization of the absolute sum of differences for determining the path. The path may take any route, such as represented by the vectors from time $t_i$ to time $t_{i+1}$. The different possible paths represent different possible velocity profiles.

The correct path is selected based on differences between the times. In act 18, differences are determined. The differences are between the possible velocities of adjacent times. FIG. 6 shows the vectors for time $t_i$ to time $t_{i+1}$. Similarly, differences between the different combinations for other pairs of adjacent times are determined, such as calculating differences for time $t_{i+1}$ to time $t_{i+2}$ and so on in a moving window. In alternative embodiments, the differences are determined between non-adjacent times, such as time $t_i$ to time $t_{i+2}$.

The differences for two given times are between all of the possible values. For example, a difference is determined for each of the vectors in the graph in FIG. 6 for time $t_i$ to time $t_{i-1}$. Differences are determined between the positive value of time $t_i$ with the positive wrap, unwrap, and negative values of time $t_{i+1}$. Differences are determined between the original value of time $t_i$ with the positive, original, and negative values of time $t_{i+1}$. Differences are determined between the negative value of time $t_i$ with the positive, original, and negative values of time $t_{i+1}$. In other embodiments, the vectors are reversed.

In alternative embodiments, the differences are determined for a sub-set of combinations of possible values. For example, the positive unwrap of the later time is not used in the differences. The number of vectors is reduced to six instead of nine. This may be done where neighbor analysis or other knowledge indicates no aliasing with respect to the positive unwrap. As another example, the original value is not used, such as where velocity is known to be aliased by image analysis. In yet another example, only one possible value for a given time is used, such as where the velocity for the time has already been selected.

Any difference function may be used. In one embodiment, derivatives are calculated. Since the difference is between values at different times, a temporal derivative is calculated. The first, second, or greater order derivative may be used. The first order derivative for the time point $t_i$ is approximated as a forward finite difference as:

$$v'(t_i)=v(t_{i+1})-v(t_i)$$

where v is the velocity or possible value and v' is the first order derivative of the velocity. When using second derivatives, the finite differences are approximated as:

$$v''(i)=v(i+1)-2v(i)+v(i-1)$$

where v" is the second order derivative of velocity. Other representations may be used.

Since the second order derivative uses possible values from three times, the number of vectors or nodes in each layer (row) is greater. For first order derivative represented in FIG. 6, three vectors or differences are determined for each possible value at a give time. For the second order derivative, nine vectors or differences are determined for each possible value at a given time.

The vectors represent the differences. The differences may be used as a cost. Since the velocity profile should be smooth over time, large differences impose a larger cost and small or no differences impose a lesser cost. The cost of a directed edge between two nodes (circles) in this graph is assigned as the first order derivative, second order derivative, or other difference computed from the possible velocities based on the labels of these two nodes.

In act 20, one of the possible values is selected for each time. The node associated with the minimum cost path for the velocity profile is selected. The original value, positive value, or negative value is selected for each time. The selected value is the unaliased velocity value for the location at the time.

By selected for different times, the unaliased velocities over time are provided. The selections for the various frames or times are based on the path through the graph. The cost is calculated over all, most, or a sub-set of times. For example, the differences associated with other times or the entire profile are used to determine the selection for each time.

In one embodiment, the differences are minimized. The path with the minimum differences through the graph is selected. The possible values over time minimizing the differences are identified. The sum of the differences across the different times is minimized. The absolute value of the differences may be used. For example, the absolute values of the second or first order derivatives are computed at each time. The sum of absolute values over time associated with a minimum or smallest value indicates the possible values to select as the actual velocities. Other cost functions or selection functions using the differences and/or other variables may be used.

Figure 7:
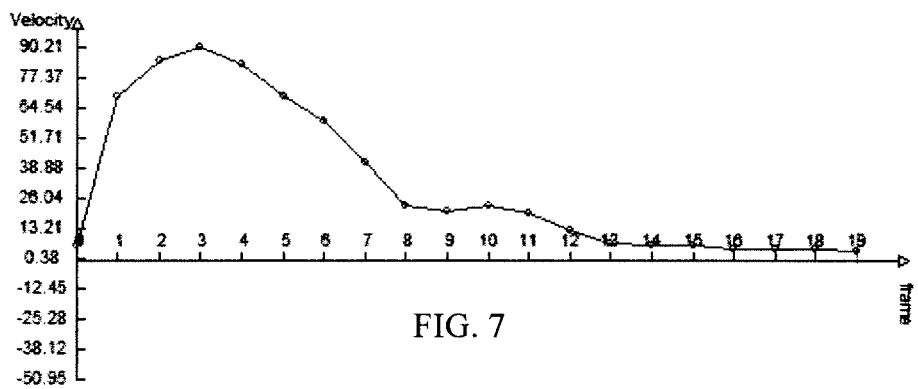
FIG. 7 is an example graph of the velocity profile of FIG. 4, but after aliasing correction.

The selected velocities provide a velocity profile. The velocity as a function of time with the minimum differences is determined. FIG. 7 shows an example of unaliasing the aliased velocities shown in FIG. 4. The negative values are selected for frames 1-5. For the other frames, the original values are selected. These selections minimize the differences along the entire velocity profile and corresponding graph. Minimization of the energy (e.g., differences in velocity) based on the second order derivative favors profiles with smooth velocity changes. Minimization of the energy based on the first order derivative favors profiles with minimum velocity changes. The velocity profile for the label set which has the minimum energy is returned as a solution.

The vectors of the graph represent possible profiles. The minimization of the differences identifies the profile of the possible profiles with the least cost. This selected path through the graph provides velocities for the profile with the least overall cost for the profile. The selection using the graph provides dynamic programming with a bottom-up approach. The label set with minimum energy is found instead of brute forcing all possible label combinations, which grows exponentially with the number of time points.

Figure 5:
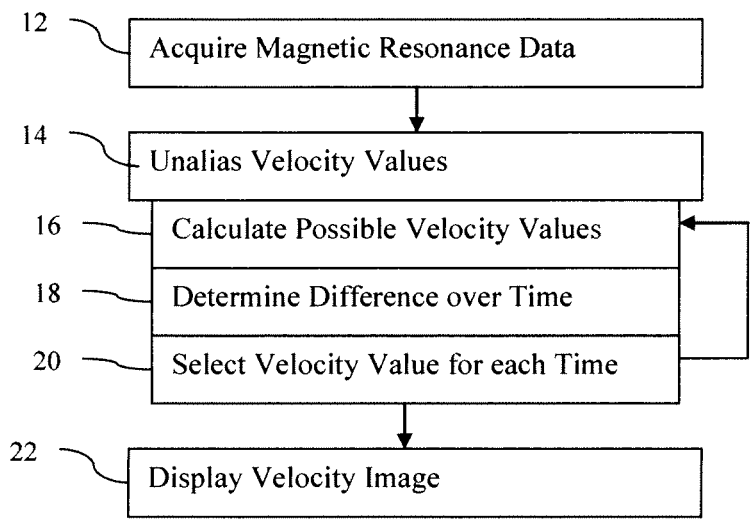
FIG. 5 is a flow chart diagram of a method for phase unwrapping in phase contrast magnetic resonance (MR) imaging, according to one embodiment.

FIG. 5 shows a loop back from act 20 to act 16. This loop represents repetition of the unaliasing. This repetition is provided for other locations. An unaliased velocity profiles is determined for each location in the frames, each location of interest in the patient, or for sub-sets of locations. In alternative embodiments, the repetition is not provided and the velocity profile is determined for one location.

In act 22, an image is displayed. The image is a function of the velocity. For example, a velocity at a given time is displayed. The display may be text, a graph, or part of a spatial distribution. For example, the velocity profile is displayed as a graph. As another example, the velocity is used to color code or mapped to grayscale for a phase contrast MR image representing velocities at different locations in a plane. The image is a two-dimensional image or a rendering from voxel data representing three-dimensions. The velocities from other locations and/or the same locations but other times may be used in a given image.

In one embodiment, a sequence of images is generated. The velocities representing the different locations in a two- or three-dimensional region are provided for different times. The velocity profiles for different locations are used for the sequence. The images of the sequence correspond to the frames of phase contrast MR data. For each time, a velocity image is generated.

Alternatively, interpolation, filtering or other process is used to upsample, downsample, or provide different temporal sampling for the display sequence than the acquisition sequence. Since the velocity profile is known, the velocity values for any time, even times other than acquisition times, may be determined and used in imaging.

The image is displayed on a display of an MRI system. Alternatively, the image is displayed on a workstation, computer or other device. The image may be stored in and recalled from a PACS memory.

By generating the image from unaliased velocities, aliasing artifacts may be avoided. The correct velocity may be used, assisting in diagnosis from the velocity information. Quantities, such as an average aortic velocity, may be determined and displayed to the user.

Additional images may be provided. For example, an anatomy image is displayed adjacent to the image mapped from velocities. In other embodiments, the velocity values are used to form an overlay. The overlay represents velocities and is combined with data representing the anatomy in a same image.

In the description above, the location of the patient is treated as being at a same coordinate in each frame. The velocity profiles are defined for the same pixel location over time. Stated another way, the velocities at different times are assumed or normalized to be for the same location of the patient regardless of the coordinate in the frame. For tissue and any corresponding flow region spatially that is static relative to the MR system over the period of acquisition, the assumption may be accurate.

For tissue and flow regions associated with spatial movement or shift between frames, the frames may be motion corrected. For example, a flow region in the cardiac system, near the heart or near the lungs, may move from frame to frame. A location of the aorta at one coordinate at one time may shift to another coordinate at another time. Pulsating vessels, such as the aorta, move over time. If a pixel is observed at the same position over time, the location represented at that pixel might shift inside and outside of the aorta, as the aorta is pulsating. Pixels at the boundaries of the vessel may not be anti-aliased properly.

To deal with the motion, each location is tracked over time so that the velocity used for each time for a given velocity profile is for the same location of the patient. Any motion correction between adjacent pairs of the frames is performed prior to unaliasing. Since the unaliasing uses the velocity profile, the velocities for the same location are to be identified. The coordinates in different frames for a same location are identified. The different velocity values used in a profile are based on the motion corrected coordinates.

To remove the motion component in the profile, the correspondence between pixels over time is determined. Anatomy MR data is used to track motion. A motion corrected velocity profile is built. Any tracking may be used to identify the data representing the same location in the patient at different times. For example, correlation or other measure of similarity is used to track features over time. A kernel of data of one frame is compared with the other after any rotation and/or translation. The rotation and/or translation associated with the greatest correlation (e.g., minimum sum of absolute differences) indicate the motion between the frames. Any rigid or non-rigid motion correction may be used.

In one embodiment, the motion correction is an inverse consistent deformable registration. Forward and backward deformation fields between any frame and a reference frame are extracted. A deformation field between any pair of frames in a time sequence is established using the formula:

$$\Phi_{pq} = \Phi_{1p} \circ \Phi_{1q}^{-1}$$

where $\Phi_{1_p}$ is the deformation field between frame p and the reference frame and $\Phi_{1_q}^{-1}$ is the inverse deformation field between frame q and the reference frame. The reference frame may be any of the frames. The reference frame is kept the same or may change, such as determining deformation in a moving temporal window.

Pixel-wise dense forward and backward deformation fields are estimated with the inverse-consistent non-rigid registration. A gradient of a symmetric energy functional is iteratively descended by alternating a registration direction after each iteration while enforcing inverse consistency.

The general motion compensation and its fast computation require the availability of both forward and backward deformation fields $\Phi_{1_p}$ and $\Phi_{1_q}^{-1}$. The inverse consistent non-rigid registration algorithm estimates both deformation fields using an interleaved optimization scheme and maintains the symmetry and inverse-consistency of image alignment. In this optimization, the gradient of a symmetric energy functional is descended by alternating the registration direction after each iteration. At the same time, inverse consistency is enforced through updating the inverse direction.

The inverse-consistency optimization may be flexibly combined with variant non-rigid algorithms, such as Free Form Deformation/B-Spline based methods. In one embodiment, the inverse-consistency optimization is performed with a variational registration framework, as the variational registration framework produces the pixel-wise deformation field used by a matrix description of motion compensation. Specifically, the image alignment is achieved as the solution to a calculus of variation problem, which is solved by performing a compositional update step corresponding to a partial differential transport equation. The regularization is added by low-pass filtering the gradient images which are in turn used as a velocity field to drive the transport equation.

To speedup the convergence and avoid local minima, a multi-scale image pyramid is created and used. The registration is repeated for different resolutions where the motion determined for a lower resolution is used as the feedback for limiting the search range for registration in a higher resolution. The local cross correlation is the image similarity measure, as the explicit derivative may be more efficiently calculated than mutual information and still general enough to cope with intensity fluctuation and imaging noise. Mutual information may alternatively be used. The numerical implementation of this scheme may be performed efficiently, and the resulting algorithm requires little extra time per iteration when compared to a one-directional method.

One example of the inverse-consistent non-rigid registration is shown in U.S. Published Application No. 2012-0121200 (Ser. No. 13/291,370, filed Nov. 8, 2011), the disclosure of which is incorporated herein by reference. The embodiments show calculating a first update of a forward transformation of a first digital image to a second digital image from a previous update of the forward transformation and a gradient of a cost function of the first and second digital images. A first update of a backward transformation of the second digital image to the first digital image is calculated from an inverse of the first update of the forward transformation. A second update of the backward transformation is calculated from first update of the backward transformation and the gradient of a cost function of the second and first digital images. A second update of the forward transformation is calculated from an inverse of the second update of the backward transformation.

Using the motion correction, a profile of the velocities for the same patient location is assembled. The same patient location in each frame is determined. The coordinates of any given frame for the location may be the same or different than in other frames. The velocities for the same patient location are used for the velocity profile based on the tracking. The aliasing is performed using the motion corrected velocity profiles.

Figure 8:
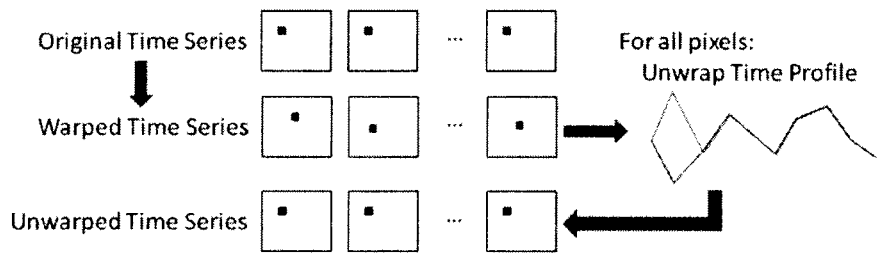
FIG. 8 represents a process flow for unaliasing with motion correction, according to one embodiment.

FIG. 8 shows one embodiment combining the motion correction and the anti-aliasing of FIG. 5. This process flow is a naïve approach. A series of frames are acquired. The motion corrected velocity profile is precomputed. The pixel in the first frame is tracked in the other frames using the deformation field. The position and therefore velocity of the location is determined in other frames by motion correction, resulting in a warped time series. A deformation field provides the tracking for different locations. Velocity profiles for each tracked location are determined from the warped time series. The velocity profiles are then anti-aliased. The actual velocities resulting from unaliasing provide an unwrapped time series. Due to the motion correction, the coordinates in each frame associated with the velocity from the unwrapped time series may be different than other frames. The unwrapped profile is transferred back to the original image sequence using the inverse deformation fields.

Figure 9:
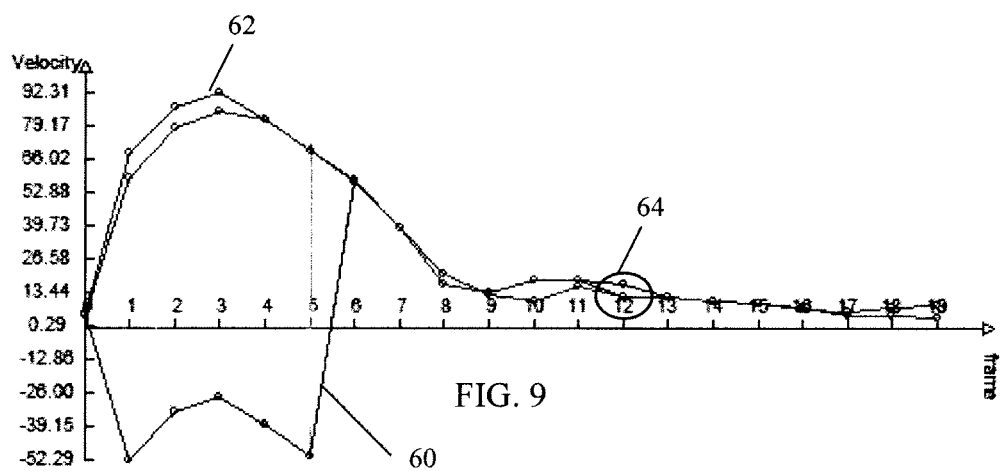
FIG. 9 is an example graph of velocity profiles using the motion correction of FIG. 8.

All pixels in the vessel are corrected, even pixels on the boundary. FIG. 9 shows correction of an aliased profile 60. The corrected profile is shown as 62. This approach of FIG. 8 may slightly change the velocity values due to the interpolations during the application of the deformation fields. This is illustrated in FIG. 9 at 64. The final velocity profile is not equal to the original profile even in areas that were not aliased, such as frame 12 showing a difference between the unaliased profile and the original profile.

Figure 10:
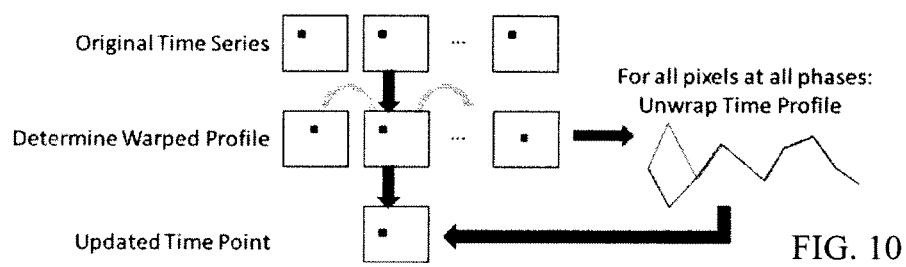
FIG. 10 represents a process flow for unaliasing with motion correction, according to another embodiment.

A different process flow may be used to avoid interpolation error. FIG. 10 represents another embodiment of combining motion correction with anti-aliasing. In the approach of FIG. 10, the determination and selection for anti-aliasing are performed separately for each of the different times. The velocity profile over the sequence is completely formed for each time. Different possible and actual profiles may result for different times even for the same location. The solution is performed for each of the different times in the sequence rather than once for the entire sequence.

To correct the velocity of a given pixel at frame p, the positions and velocities of that pixel in all other frames using the forward and backward deformation fields are determined. A velocity profile of velocity over time, including the frame p and other frames is determined. This velocity profile is then unwrapped using the dynamic programming. Out of the unwrapped profile, only the new velocity at frame p is used. This process is repeated for all other frames (times) to determine the corrected velocities at all frames of the image sequence for the given pixel. For frame p+1, the velocity profile is determined again after applying the motion correction. The velocity profile extends across frames p, p+1, and other frames. Out of the unwrapped profile, only the selected velocity at frame p+1 is used.

Figure 11:
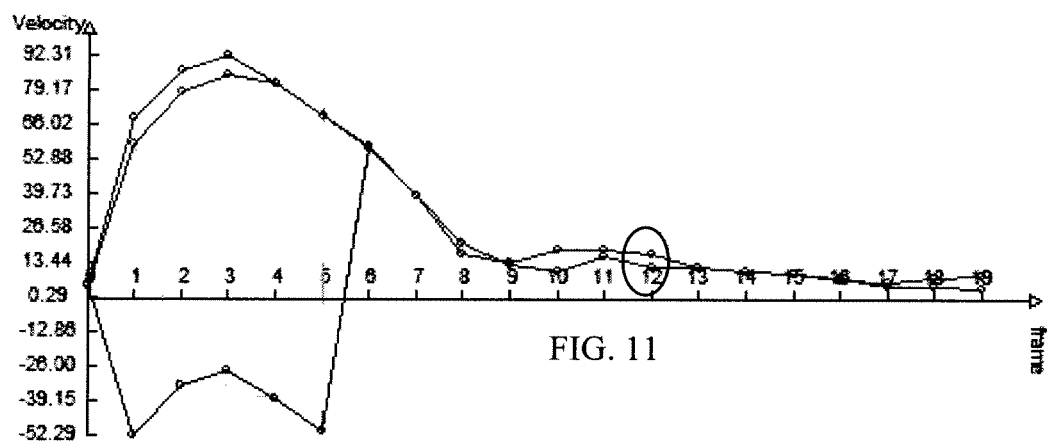
FIG. 11 is an example graph of velocity profiles using the motion correction of FIG. 10.

This approach is accurate and interpolation-free. The velocity values are not altered other than unwrapping if necessary. FIG. 11 shows the results. At frame twelve, the difference in profiles is between a corrected velocity and a final velocity. The original velocity is the same as the corrected velocity. Due to the involved computational complexity, the approach may be slower.

The flow of FIGS. 5, 6, 8, and/or 10 may be implemented as a program. For example, the flow is implemented as a mixture of C++ and Matlab, but other languages may be used. A processor operates pursuant to instructions of the program to perform anti-aliasing with or without motion correction.

Figure 12:
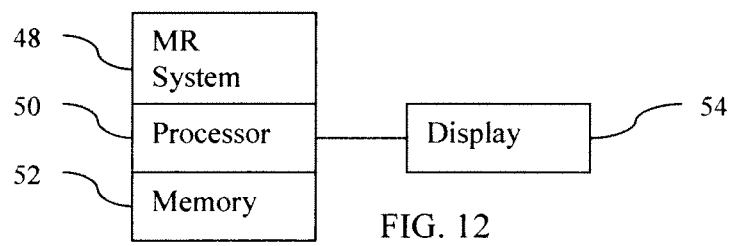
FIG. 12 is one embodiment of a system for phase unwrapping in phase contrast magnetic resonance (MR) imaging.

FIG. 12 shows a system for phase unwrapping in phase contrast magnetic resonance (MR) imaging. The system includes an MR system 48, a memory 52, a processor 50, and a display 54. Additional, different, or fewer components may be provided. For example, a network or network connection is provided, such as for networking with a medical imaging network or data archival system. In another example, a user interface is provided.

The processor 50 and display 54 are part of a medical imaging system, such as the MR system 48. Alternatively, the processor 50 and display 54 are part of an archival and/or image processing system, such as associated with a medical records database workstation or server. In other embodiments, the processor 50 and display 54 are a personal computer, such as desktop or laptop, a workstation, a server, a network, or combinations thereof. The processor 50, display 54, and memory 52 may be provided without other components for implementing motion compensation in MRI.

The MR system 48 includes one or more coils. For example, a whole body coil is provided. In other examples, an array of local coils is provided. The MR system 48 includes a main field magnet, such as a cryomagnet, and gradient coils. Other processing components may be provided, such as for planning and generating transmit pulses for the coils based on the sequence and for receiving and processing the received k-space data.

The memory 52 can be a graphics processing memory, a video random access memory, a random access memory, system memory, random access memory, cache memory, hard drive, optical media, magnetic media, flash drive, buffer, database, combinations thereof, or other now known or later developed memory device for storing data or video information. The memory 52 is part of the MR system 48, part of a computer associated with the processor 50, part of a database, part of another system, a picture archival memory, or a standalone device.

The memory 52 stores data representing a region, at different times, of a patient. The data is MR data, such as k-space or object space data. The region is a two or three-dimensional region. The region is of any part of the patient, such as a region within the chest, abdomen, leg, head, arm, or combinations thereof. The data is from scanning the region by the MR system 48. The memory 52 may alternatively or additionally store data during processing, such as storing a directed graph, possible velocities, a sequence, deformation field, differences, paths, registration information, reconstruction information, and/or an output image.

The memory 52 or other memory is alternatively or additionally a non-transitory computer readable storage medium storing data representing instructions executable by the programmed processor 50 for phase unwrapping in phase contrast magnetic resonance (MR) imaging. The instructions for implementing the processes, methods and/or techniques discussed herein are provided on non-transitory computer-readable storage media or memories, such as a cache, buffer, RAM, removable media, hard drive or other computer readable storage media. Non-transitory computer readable storage media include various types of volatile and nonvolatile storage media. The functions, acts or tasks illustrated in the figures or described herein are executed in response to one or more sets of instructions stored in or on computer readable storage media. The functions, acts or tasks are independent of the particular type of instructions set, storage media, processor or processing strategy and may be performed by software, hardware, integrated circuits, firmware, micro code and the like, operating alone, or in combination. Likewise, processing strategies may include multiprocessing, multitasking, parallel processing, and the like.

In one embodiment, the instructions are stored on a removable media device for reading by local or remote systems. In other embodiments, the instructions are stored in a remote location for transfer through a computer network or over telephone lines. In yet other embodiments, the instructions are stored within a given computer, CPU, GPU, or system.

The processor 50 is a general processor, central processing unit, control processor, graphics processor, digital signal processor, three-dimensional rendering processor, image processor, application specific integrated circuit, field programmable gate array, digital circuit, analog circuit, combinations thereof, or other now known or later developed device for phase unwrapping in phase contrast magnetic resonance (MR) imaging. The processor 50 is a single device or multiple devices operating in serial, parallel, or separately. The processor 50 may be a main processor of a computer, such as a laptop or desktop computer, or may be a processor for handling some tasks in a larger system, such as in an imaging system. The processor 50 is configured by instructions, design, hardware, and/or software to perform the acts discussed herein, such as anti-aliasing with or without motion correction.

The processor 50 is configured to unalias velocity values. For example, possible unaliased values are calculated. Using the velocity scale setting (VENC), a finite set of possible velocities may be determined from an input velocity. A cost function is applied to determine which of the possible velocities to use. The cost function relates velocities from different times, relying on the general smoothness or gradual transitions expected from a velocity over time. Using the first or second derivative in the cost function promotes smoothness or gradual transitions. The sums of the absolute differences along different paths or combinations of possible values into profiles are calculated. The path and corresponding possible values resulting in the minimum cost represent the unaliased velocity profile.

The processor 50 may be configured to perform motion correction or motion compensation. The velocity profiles for a given location of the patient are determined. Motion correction, such as through inverse consistent deformation, is used to identify the data from different frames associated with a given location.

The display 54 is a monitor, LCD, projector, plasma display, CRT, printer, or other now known or later developed devise for outputting visual information. The display 54 receives images, graphics, text, quantities, or other information from the processor 50, memory 52, or MR system 48. One or more MR images are displayed. The images are of dynamic or moving tissue, such as the heart, but have reduced or no aliasing even with a VENC set too low. The aliasing is corrected. In one embodiment, the images are phase contrast MR images.

While the invention has been described above by reference to various embodiments, it should be understood that many changes and modifications can be made without departing from the scope of the invention. It is therefore intended that the foregoing detailed description be regarded as illustrative rather than limiting, and that it be understood that it is the following claims, including all equivalents, that are intended to define the spirit and scope of this invention.

We claim:

1. A method for phase unwrapping in phase contrast magnetic resonance (MR) imaging, the method comprising:
   acquiring a sequence of phase contrast MR data representing a patient, the phase contrast MR data comprising first values representing a location at respective different times, some of the first values being wrapped values and some of the first values being not wrapped values;
   calculating positive and negative values with positive and negative direction unwrapping from the first values for each of the different times;
   determining, for each adjacent pair of the different times, differences between combinations of first, positive, and negative values between the different times of the adjacent pair;
   selecting between the first, positive, and negative values for each of the different times as a function of a minimization of a sum of the differences across the different times; and
   generating an image as a function of the selected first, positive, and negative values.

2. The method of claim 1 wherein acquiring comprises acquiring with an MR system, the phase contrast MR data being part of a plurality of frames of the sequence, wherein the calculating, determining and selecting are performed for each of a plurality of locations including the location, and wherein generating the image comprises generating a velocity image representing the locations.

3. The method of claim 1 wherein calculating positive and negative values comprises subtracting two times a velocity scale from the first value for the positive value and adding the two times the velocity scale to the first value for the negative value.

4. The method of claim 1 wherein calculating comprises generating a graph with a number of columns being equal to a number of the different times and a number of rows being equal to a number of labels, and wherein selecting comprises selecting one of the labels for each of the different times.

5. The method of claim 1 wherein determining comprises performing the difference as a first derivative.

6. The method of claim 1 wherein determining comprises performing the difference as a second derivative.

7. The method of claim 1 wherein determining the differences between combinations comprises determining differences between the positive value of a first time of the different times with the positive, first, and negative values of a second time of the different times, determining differences between the first value of the first time with the positive, first, and negative values of the second time of the different times, and determining differences between the negative value of the first time with the positive, first, and negative values of the second time of the different times.

8. The method of claim 1 wherein selecting comprises minimizing a path through the different times.

9. The method of claim 1 wherein the positive, first, and negative values of different times form possible profiles, and selecting comprises selecting a final profile from the possible profiles.

10. The method of claim 1 further comprising:
    motion correcting between the adjacent pairs of the different times prior to the determining and selecting.

11. The method of claim 10 further comprising:
    repeating the determining and selecting for each of the different times.

12. In a non-transitory computer readable storage medium having stored therein data representing instructions executable by a programmed processor for phase unwrapping in phase contrast magnetic resonance (MR) imaging, the storage medium comprising instructions for:
    unaliasing velocities with a cost function based on minimization of an absolute sum of temporal derivatives along a graph of possible values over time;
    generating an image as a function of the unaliased velocities.

13. The non-transitory computer readable storage medium of claim 12 wherein unaliasing comprises:
    calculating a positive corrected velocity and a negative corrected velocity from an initial velocity for each of different times, the initial velocity, positive corrected velocity, and negative corrected velocity comprising the possible values;
    calculating temporal derivatives between all possible combinations of the possible values between adjacent times through all the different times; and
    selecting one of the possible values for each of the different times based on the minimization.

14. The non-transitory computer readable storage medium of claim 12 wherein unaliasing is performed for each of a plurality of spatial locations in frames of phase contrast MR data, the phase contrast MR data comprising the velocities, and wherein generating the image comprises generating a sequence of images from the unaliased velocities, each of the images corresponding to each of the frames.

15. The non-transitory computer readable storage medium of claim 12 further comprising:
    tracking a location for the velocities over the time;
    assembling a profile of the velocities for the location as a function of the tracking;
    wherein unaliasing comprises unaliasing the profile of the velocities for the location.

16. The non-transitory computer readable storage medium of claim 15 wherein the assembling and unaliasing are performed for each of different times.

17. In a non-transitory computer readable storage medium having stored therein data representing instructions executable by a programmed processor for phase unwrapping in phase contrast magnetic resonance (MR) imaging, the storage medium comprising instructions for:
    generating a graph of different velocity values for a location at each of different times;
    determining a velocity profile of velocity as a function of time from a path with a minimum cost through the graph, the path having one of the different velocity values for each of the times; and
    generating an image as a function of the velocity profile.

18. The non-transitory computer readable storage medium of claim 17 wherein generating the graph comprises:
    receiving a first value for the location for each of the different times;
    adding two times a velocity scale to the first value, resulting in a second value;
    subtracting two times the velocity scale to the first value, resulting in a third value;
    wherein the different velocity values comprise the first value, the second value, and the third value.

19. The non-transitory computer readable storage medium of claim 17 wherein determining comprises determining with the minimum cost comprising a first or second derivative.

20. The non-transitory computer readable storage medium of claim 17 further comprising:

identifying coordinates in different frames for the location, wherein the different velocity values are based on the coordinates;

wherein determining the velocity profile comprises solving for each of the different times separately with the graph.

* * * * *